United States Patent [19]

Takamori et al.

[11] Patent Number: 5,194,400

[45] Date of Patent: Mar. 16, 1993

[54] METHOD FOR FABRICATING A SEMICONDUCTOR LASER DEVICE USING $(Al_xGa_{1-x})_yIn_{1-y}P$ SEMICONDUCTOR CLAD LAYERS

[75] Inventors: Akira Takamori, Atsugi; Ken Idota, Kawasaki; Kiyoshi Uchiyama, Kawasaki; Masato Nakajima, Kawasaki, all of Japan

[73] Assignee: Matsushita Electric Industrial Co., Ltd., Osaka, Japan

[21] Appl. No.: 800,376

[22] Filed: Nov. 29, 1991

[30] Foreign Application Priority Data

Nov. 28, 1990 [JP] Japan ................................ 2-332398
Sep. 25, 1991 [JP] Japan ................................ 3-245604

[51] Int. Cl.⁵ ............... H01L 21/20; H01L 21/203; H01L 21/205
[52] U.S. Cl. .................... 437/129; 437/126; 148/DIG. 95; 372/45; 257/79
[58] Field of Search ........ 437/129, 133, 126; 357/17; 148/DIG. 95; 372/45, 46

[56] References Cited

U.S. PATENT DOCUMENTS

| | | | |
|---|---|---|---|
| 4,567,060 | 1/1986 | Hayakawa et al. | 372/46 |
| 4,663,829 | 5/1987 | Hartman et al. | |
| 4,716,129 | 12/1987 | Taneya et al. | 437/129 |
| 4,839,308 | 6/1989 | Fye | 437/129 |
| 4,855,250 | 8/1989 | Yamamoto et al. | 148/DIG. 95 |
| 4,902,644 | 2/1990 | Wilt | 357/17 |
| 5,082,799 | 1/1992 | Holmstrom et al. | 437/129 |
| 5,089,437 | 2/1992 | Shima et al. | 437/129 |

FOREIGN PATENT DOCUMENTS

| | | | |
|---|---|---|---|
| 420143 | 4/1991 | European Pat. Off. | 437/129 |
| 59-72787 | 4/1984 | Japan | 437/129 |
| 59-197182 | 11/1984 | Japan | 437/129 |
| 61-42986 | 3/1986 | Japan . | |

OTHER PUBLICATIONS

"Development of Semiconductor Lasers by a Production-Type MBE" by H. Tanaka et al.; Applied Phisics, vol. 54, No. 11 (1985).

*Primary Examiner*—Brian E. Hearn
*Assistant Examiner*—Kevin M. Picardat
*Attorney, Agent, or Firm*—Lowe, Price, LeBlanc & Becker

[57] ABSTRACT

A method for fabricating an AlGaInP-based visible light laser device by molecular beam epitaxy is described. In this method, a upper clad layer of $(Al_xGa_{1-x})_yIn_{1-y}P$ wherein x and y are, respectively, in the ranges of from 0.5 to 1 and from 0.47 to 0.53 is covered with a protective layer serving also as an etching prevenive layer so that a grooved-type structure using the $(Al_xGa_{1-x})_yIn_{1-y}P$ clad layer can be fabricated without involving degradation of the clad layer by contamination with oxygen, nitrogen and the like.

9 Claims, 3 Drawing Sheets

METHOD FOR FABRICATING A SEMICONDUCTOR LASER DEVICE USING $(Al_xGa_{1-x})_yIn_{1-y}P$ SEMICONDUCTOR CLAD LAYERS

BACKGROUND OF THE INVENTION

1. Field of The Invention

This invention relates to a method for fabricating an $(Al_xGa_{1-x})In_{1-y}P$ semiconductor-based visible light laser device by molecular beam epitaxy.

2. Description of The Prior Art

Fabrication of semiconductor laser devices by molecular beam epitaxial (MBE) apparatus has been recently proposed. The fabrication using the MBE apparatus requires at least two MBE growth steps. These steps are described below.

In the first step, a first expitaxially grown structure including a lower clad layer, an active layer and an upper clad layer is built up on a semiconductive substrate. After the epitaxial growth, the substrate is withdrawn from a MBE chamber to an atmospheric environment. Then, a stripe groove is formed in the structure, for example, by a photo etching procedure. After removal of impurities, which have been attached during the photo etching procedure, from the substrate surface and also of an oxide film inevitably formed on the surface of the substrate by exposure to the air, a second MBE step is effected to form a second growth film on the grooved structure.

However, where the clad layer is made, for example, of $(Al_xGa_{1-x})_{0.5}In_{0.5}P$ wherein x is not smaller than 0.4, the impurities and oxide film as mentioned above are difficult to evaporate. In fact, such impurities and oxide film cannot be removed by an ordinary thermal treatment, such as thermal cleaning or thermal etching, in the MBE growth chamber. This presents the problems that there are produced crystal defects at the interface between the clad layer and the second growth layer formed in the subsequent step and that crystallinity of the second growth layer is degraded. More particularly, the high resistance layer is undesirably formed at or in the vicinity of the interface, so that the electric current may become difficult to pass or the high resistance layer may serve as a light absorption layer. Thus, it will be difficult to fabricate a semiconductor laser device which has good electric and optical properties.

SUMMARY OF THE INVENTION

It is accordingly an object of the invention to provide a method for fabricating a visible light semiconductor device by molecular beam epitaxy which can solve the problems of the prior art.

It is another object of the invention to provide a method for fabricating a $(Al_xGa_{1-x})In_{1-y}P$-based visible light semiconductor laser device which has a grooved-type structure wherein the $(Al_xGa_{1-x})In_{1-y}P$ clad layer is appropriately prevented from contamination with impurities or oxygen.

It is a further object of the invention to provide a method for fabricating a visible light semiconductor laser device of the index guided wave type.

The above objects can be achieved, according to the invention, a method for fabricating a visible light semiconductor laser device by molecular beam epitaxy, the method comprising:

subjecting a semiconductor substrate to a first growth procedure to built up on the substrate a lower clad layer made of a semiconductor of one conductivity type of the formula, $(Al_xGa_{1-x})_yIn_{1-y}P$, wherein x is in the range of from 0.5 to 1 and y is in the range of from 0.47 to 0.53, an active layer, an upper clad layer made of a semiconductor of the other conductivity type of the formula, $(Al_xGa_{1-x})_yIn_{1-y}P$, wherein x and y have, respectively, the same meanings as defined above, a protective layer, and a current blocking layer in this order, wherein the protective layer is made of a semiconductor which is more unlikely to be etched than a semiconductor of the current blocking layer, thereby obtaining a built-up structure on the substrate;

etching the current blocking layer to a level of the protective layer to make a stripe groove with a predetermined width with which current passage is narrowed;

removing the protective layer in the stripe groove; and subjecting the thus removed built-up structure to a second growth procedure to form a cap layer on the built-up structure.

The protective layer serves to protect the the upper clad layer and also as an etching-preventive layer. The protective layer is preferably made of a GaInP semiconductor. The device may further comprise, in place of the cap layer, a layer which has a double-layer structure including a layer of a semiconductor of the other conductivity type of the formula, $(Al_xGa_{1-x})_yIn_{1-y}P$, wherein x and y have, respectively, the same meanings as defined above, in such a way that the layer is in contact with the upper clad layer through the groove portion and a GaAs layer of the other conductivity type formed on the first-mentioned layer whereby the resultant device is of the index guided wave type with an improved efficiency.

DETAILED DESCRIPTION AND EMBODIMENTS OF THE INVENTION

The fabrication method of the invention is described with reference to the accompanying drawings and particularly, to FIGS. 1a to 1e.

Figure 1A:
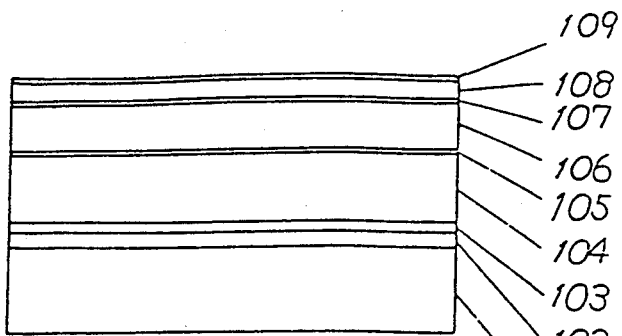
FIGS. 1a to 1e are schematic views showing a fabrication procedure of an $(Al_xGa_{1-x})_yIn_{1-y}P$-based visible light semiconductor laser device according to one embodiment of the invention.

In the method of the invention, a substrate of one conductivity type 101 as shown in FIG. 1a is first provided and placed in a molecular beam epitaxy apparatus. The substrate is, for example, a GaAs substrate which is doped with an impurity such as Si to make a desired conductivity type. The substrate is heated to a predetermined temperature. Starting materials are, respectively, placed in molecular beam source cells and each evaporated in the form of a molecular beam along with an impurity to be incorporated so that a desired conductivity is imparted.

Phosphorus (P) is fed to the substrate by introducing $PH_3$ (phosphine) from outside and decomposed into $P_2$ in a thermal decomposition cell.

In the first step of the MBE technique, the respective starting materials such as Al, Ga, In, As and the like are fed to the substrate while controlling the temperature of the molecular beam source cells of the respective materials, the flow rate of the phosphine gas and the opening and closing operations of the cell shutters. By the control, a lower clad layer 104 which is made of $(Al_xGa_{1-x})_yIn_{1-y}P$ of one conductivity type wherein x and y are, respectively, in the ranges of from 0.5 to 1 and 0.47 to 0.53, is formed on the substrate 101. Then, an active layer 105 which is made of an undoped semiconductor such as GaInP, AlGaInP or the like is formed on the lower clad layer 104 in an appropriate thickness, for example, of from 0.8 to 1.0 μm. Subsequently, an upper clad layer 106 is formed on the active layer 105 in a thickness, for example, of from 0.04 to 0.1 μm. The upper clad layer 106 is made of $(Al_xGa_{1-x})_yIn_{1-y}P$ of the other conductivity type wherein x and y have, respectively, the same meanings as defined above. On the upper clad layer 106 are further formed a protective layer 107 in a thickness, for example, of from 0.005 to 0.1 μm and a current blocking layer 108 in a thickness, for example, of from 0.2 to 1.0 μm in this order. The protective layer 107 is made of a semiconductor of the other conductivity type which is more unlikely to be etched than the semiconductor of the current blocking layer 108. The protective layer 107 is preferably made of $Ga_zIn_{1-z}P$, wherein z is in the range of from 0.47 to 0.53, such as $Ga_{0.5}In_{0.5}P$ which is removable by thermal cleaning. The current blocking layer 108 is made of a semiconductor of the one conductivity type such as GaAs. Thus, a built-up structure including the lower clad layer 104, the active layer 105, the upper clad layer 106, the protective layer 107 and the current blocking layer 108 is formed on the substrate 101.

Since the protective layer 107 is formed on the upper clad layer 106 in an appropriate thickness, the layer 107 can be used as an etching preventive layer when a stripe groove is formed in a subsequent step. For instance, when hot sulfuric acid is used as an etchant, the difference in etching rate between the semiconductor materials for the protective layer 107 and the current blocking layer 108 is suitably used for control in depth of the stripe groove. In addition, the protective layer 107 made particularly of GaInP serves to protect the upper clad layer 106 having a high content of Al from being exposed to the air. The GaInP layer 107 is less susceptible to oxidation or contamination during the etching than the AlGaInP clad layer 106. This is because Al atoms exhibit higher chemical bonding with contaminants such as oxygen, nitrogen and the like.

The substrate temperatures for the formation of the respective layers may differ depending on the types of the semiconductors used. When GaAs is used for the layer 108, the substrate temperature ranges from 550° to 650° C. With $(Al_xGa_{1-x})_yIn_{1-y}P$ and GaInP, the substrate temperature ranges from 450° to 550° C.

As a matter of course, a buffer layer 102 made, for example, GaAs and a buffer layer 103 such as of GaInP may be formed between the substrate 101 and the lower clad layer 104 as is well known in the art. Likewise, a cap layer 109 such as of GaInP may be formed on the current blocking layer 108 in order that the layer is used for masking the current blocking layer 108 in mesa shape.

The substrate 101 on which the built-up structure has been formed is then withdrawn from the MBE apparatus to outside.

Figure 1B:
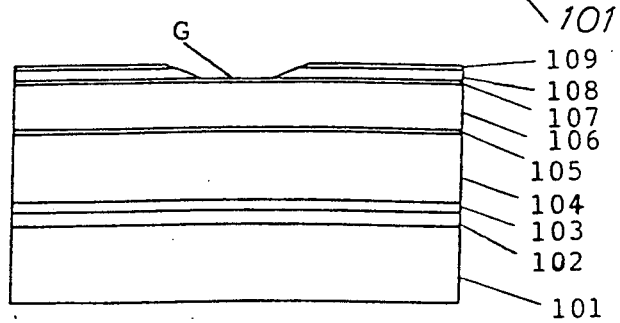

The current blocking layer 108 of the built-up structure is removed by etching to a level of the protective layer 107 in a desired pattern to form a stripe groove G with a desired width, for example, of 2 to 10 μm as shown in FIG. 1b. By this, the current passage can be appropriately narrowed.

If the cap layer 109 is present, a photoresist is formed on the cap layer 109 except for a portion where a stripe groove is to be formed. The cap layer is removed by etching through the photoresist mask. Thereafter, the photoresist is removed, the remaining portion of the cap layer 109 is used as a mask to etch the current blocking layer 108 to a level of the protective layer 107 which serves also as an etching blocking layer, thereby forming a stripe groove G.

Preferably, the stripe is grooved along the plane [110] direction so that the section of the groove is in a mesa shape.

The structure obtained in FIG. 1(b) is again placed in the MBE apparatus in which the substrate is maintained at a temperature at which the protective layer 107 and, if present, the cap layer 109 can be evaporated but the current blocking layer is not evaporated. In view of the types of semiconductors used in the present invention, the temperature is generally in the range of from 500° to 600° C. Under heating conditions set out above, a molecular beam such as of As is irradiated over the structure for a time sufficient to allow the protective layer 107 on the groove portion and the cap layer 109 to be evaporated as is particularly shown in FIG. 1c as dot lines. The time is generally in the range of from 5 to 20 minutes. This treatment is a thermal cleaning procedure. In this procedure, the oxide film and contaminating matters formed or deposited on the protective layer 107 and the cap layer 109 during the course of the stripe groove formation are simultaneously removed by evaporation. On the other hand, the current blocking layer 108 made of GaAs which is exposed at the inclined portions of the stripe groove is not etched at the temperature. As a matter of course, the oxide film and contaminating matters deposited on the exposed portions are evaporated, so that the shape of the stripe groove is not substantially changed.

Figure 1C:
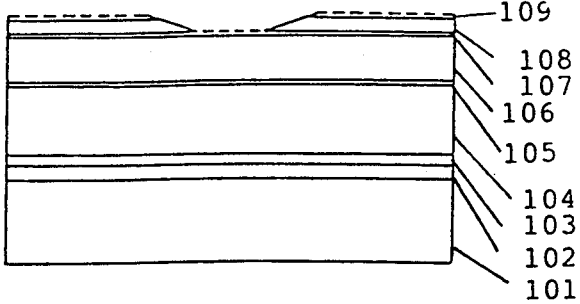
Figure 1D:
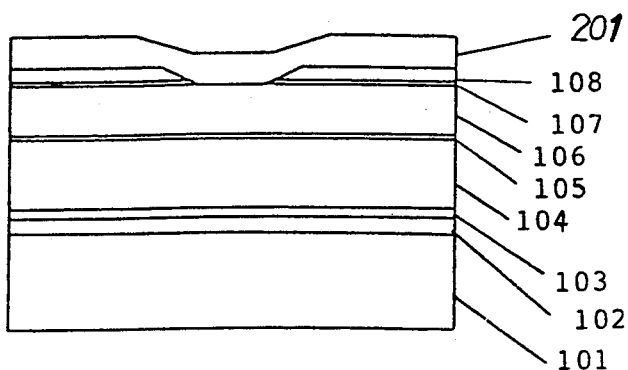

Thereafter, a contact layer 201 of a semiconductor of the other conductivity type such as GaAs is formed on the thermally cleaned surface as shown in FIG. 1d, in a thickness of from 0.2 to 1.0 μm.

Figure 1E:
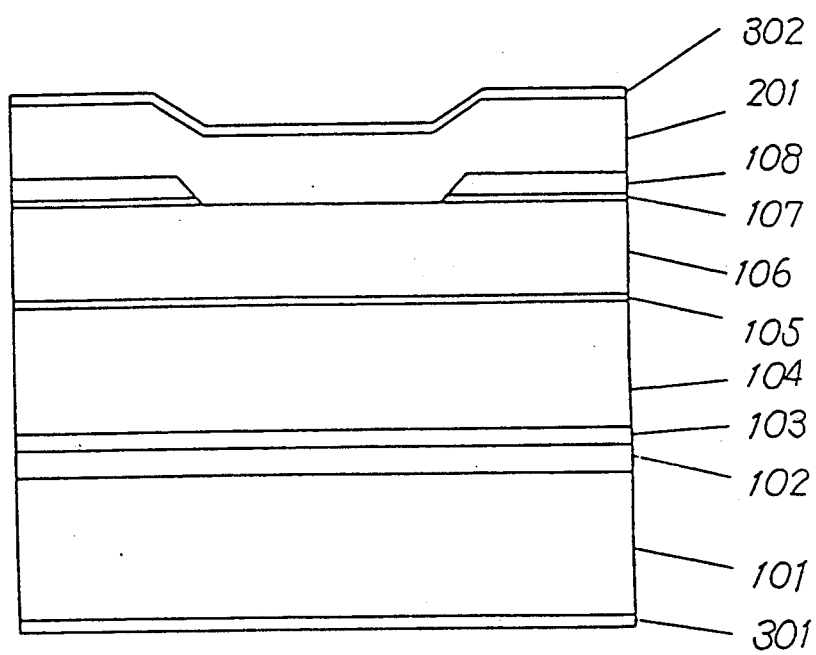

Finally, electrodes are formed on the opposite side of the substrate 101 and the contact layer 201, respectively, as shown in FIG. 1e.

Thus, the $(Al_xGa_{1-x})_yIn_{1-y}P$-based visible light semiconductor laser device having a grooved structure can be fabricated although such a device has heretofore been difficult to fabricate by prior-art MBE techniques.

Figure 2A:
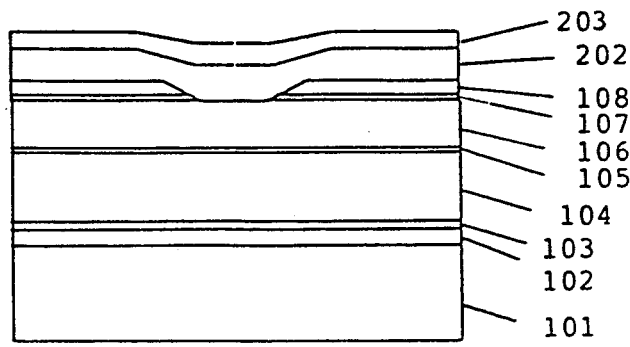
FIGS. 2a to 2b are schematic views showing a fabrication procedure of an $(Al_xGa_{1-x})_yIn_{1-y}P$-based visible light semiconductor laser device of an index guided wave type according to another embodiment of the invention.
Figure 2B:
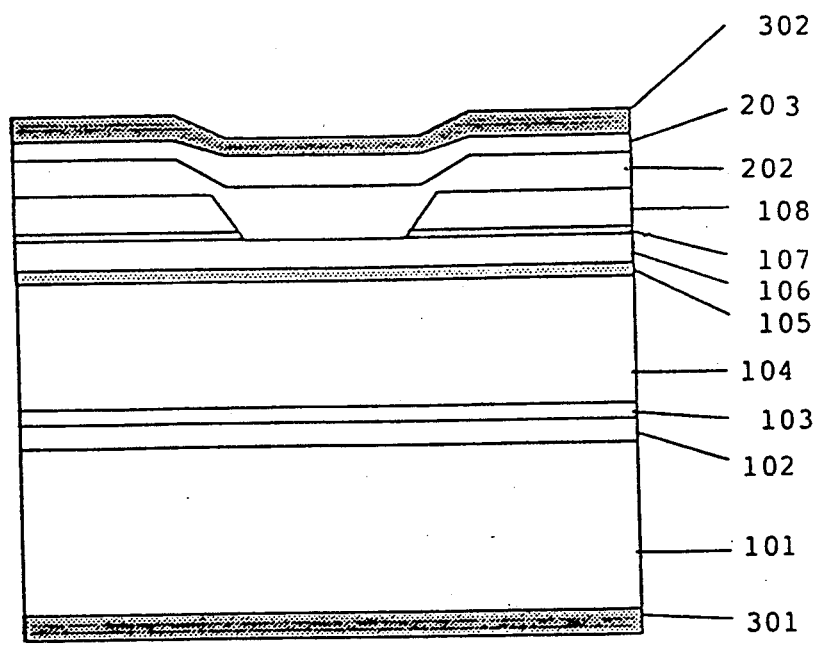

In FIGS. 2a and 2b, there is shown another embodiment wherein the procedures of the first embodiment shown in FIGS. 1a to 1c are repeated. Thereafter, a layer 202 made of $(Al_xGa_{1-x})_yIn_{1-y}P$ of the other conductivity type, wherein x and y have, respectively, the same meanings as defined hereinbefore, is formed on the thermally cleaned surface so that the layer 202 is contacted with the upper clad layer through the stripe groove G and serves as a part of the upper clad layer. Subsequently, a cap layer 203 made of GaAs of the other conductivity type as shown in FIG. 2a is formed. As will be apparent from FIG. 2b, the difference in the construction between FIGS. 1e and 2b is that the $(Al_xGa_{1-x})_yIn_{1-y}P$ layer is provided between the thermally cleaned surface and the layer 203 in FIG. 2b. This device having such construction as stated above is of the index guided wave type and is advantageous in that not only the current passage is narrowed, but also a laser beam generated can be confined appropriately.

The present invention is more particularly described by way of examples.

EXAMPLE 1

This example illustrates an embodiment which is shown in FIGS. 1a to 1e.

An n-type GaAs substrate 101 having an index of (100) direction was placed in a MBE apparatus and heated by a usual manner.

Al, Ga, In, As and appropriate impurity blocks were provided as starting materials and placed in molecular beam source cells, respectively. Phosphorus was fed on the substrate by introducing a phosphine gas from outside and decomposed in a thermal decomposition cell into $P_2$.

These starting materials other than $P_2$ were evaporated in the form of molecular beams and applied onto the substrate. By controlling the temperatures of the cells of the respective starting materials and the flow rate of the phosphine gas and also by closing or opening individual cell shutters, there were formed, on the substrate 101, a 0.2 μm thick n-type GaAs buffer layer 102, a 0.1 μm thick n-type $Ga_{0.5}In_{0.5}P$ buffer layer 103, a 0.8 μm thick n-type $(Al_{0.7}Ga_{0.3})_{0.5}In_{0.5}P$ lower clad layer 104, a 0.08 μm thick un-doped $Ga_{0.5}In_{0.5}P$ active layer 105, a 0.8 μm thick p-type $(Al_{0.7}Ga_{0.3})_{0.5}In_{0.5}P$ upper clad layer 106, a 0.1 μm thick p-type $Ga_{0.5}In_{0.5}P$ protective layer 107 serving also as an etching-preventive layer, a 0.2 μm thick n-type GaAs current blocking layer 108 and a 0.1 μm thick n-type $Ga_{0.5}In_{0.5}P$ layer 109 in this order as shown in FIG. 1a.

The above procedure is a first growth step of the MBE technique.

The substrate temperature for the growth of all the GaAs layers was 600° C. and the substrate temperature for the growth of the GaInP and AlGaInP layers was 500° C.

The substrate 101 having the built-up structure was removed from the apparatus and the n-type cap layer 109 was covered with a photoresist except for a portion through which a stripe groove was to be formed. The portion of the cap layer 109 was removed by etching with a hydrochloric acid etchant through the photoresist. After removal of the photoresist, the n-type current blocking layer 108 was etched through the remaining cap layer 109 as a mask by the use of an etchant of $H_2SO_4:H_2O_2:H_2O=4:1:1$, to an extent which reached the etching preventive layer 107 to form a stripe groove G as shown in FIG. 1b. The index of direction of the stripe groove along the lengthwise direction was set as [110] so that the section of the stripe groove was in a mesa shape.

The grooved semiconductor substrate was again placed in the MBE apparatus in which while the substrate temperature was maintained at 560° C., a molecular beam of As was irradiated as shown in FIG. 1c. The irradiation was continued for about 15 minutes to remove the cap layer 109 and the etching preventive layer 107 by evaporation as shown by dot lines (thermal cleaning step).

In this step, the oxide film and contaminating matters which had been formed or deposited on the cap layer 109 and the etching preventive layer 107 during the stripe groove forming step was simultaneously evaporated. The GaAs current blocking layer 108 which was partially exposed at inclined portions of the stripe groove was not etched since the temperature was as low as 560° C. However, the oxide film and contaminating matters formed on the exposed portions were evaporated. Thus, the stripe pattern was not changed.

Subsequently, the substrate 101 having the thus etched built-up structure on one side was subjected to a second growth step by which a 0.5 μm thick p-type GaAs layer 201 was formed as shown in FIG. 1d.

Finally, electrodes 301, 302 were attached to the other side of the substrate 101 and on the p-type GaAs layer 201, respectively, as shown in FIG. 1e.

EXAMPLE 2

The general procedure of Example 1 was repeated according to the procedures illustrated in FIGS. 1a to 1c, followed by formation of a 0.6 μm thick p-type AlGaInP layer 202 on the etched built-up structure on the substrate 101 and then a 0.5 μm thick p-type GaAs layer 203 as shown in FIG. 2a and attachment of the electrodes 301, 302 in the same manner as in Example 1 to obtain a semiconductor laser device as shown in 2b.

In these examples, the substrate of the n-type is used. If a p-type substrate was used, the conductivity types of the respective layers illustrated in the figures and examples should be reversed.

What is claimed is:

1. A method for fabricating a visible light semiconductor laser device by molecular beam epitaxy, the method comprising:

subjecting a semiconductor substrate of one conductivity type to a first growth procedure to built up on the substrate a lower clad layer made of a semiconductor of the one conductivity type of the formula, $(Al_xGa_{1-x})_yIn_{1-y}P$, wherein x is in the range of from 0.5 to 1 and y is in the range of from 0.47 to 0.53, an active layer, an upper clad layer made of a semiconductor of the other conductivity type of the formula, $(Al_xGa_{1-x})_yIn_{1-y}P$, wherein x and y have, respectively, the same meanings as defined above, a protective layer, and a current blocking layer in this order, wherein the protective layer is made of a semiconductor which is more unlikely to be etched than a semiconductor of the current blocking layer, thereby obtaining a built-up structure on the substrate;

etching the current blocking layer to a level of the protective layer to make a stripe groove with a predetermined width with which current passage is narrowed;

removing the protective layer on the stripe groove; and subjecting the thus removed built-up structure to a second growth procedure to form a cap layer on the built-up structure.

2. A method according to claim 1, wherein said semiconductor of said protective layer is a $Ga_zIn_{1-z}P$ semiconductor, wherein z is in the range of from 0.47 to 0.53.

3. A method according to claim 2, wherein said GaInP semiconductor is of the formula, $Ga_{0.5}In_{0.5}P$.

4. A method according to claim 1, wherein the protective layer is removed by application of a molecular beam of As at a temperature of from 500° to 600° C.

5. A method according to claim 1, wherein said current blocking layer is made of GaAs.

6. A method according to claim 1, wherein further comprising, in place of the cap layer, a layer which has a double-layer structure including a $(Al_xGa_{1-x})_yIn_{1-y}P$ layer of the other conductivity type, wherein x and y have, respectively, the same meanings as defined in claim 1, and a GaAs layer of the other conductivity type formed on the $(Al_xGa_{1-x})_yIn_{1-y}P$ layer of the other conductivity type, said $(Al_xGa_{1-x})_yIn_{1-y}P$ layer of the other conductivity type being in contact with the upper clad layer through the stripe groove.

7. A method according to claim 1, further comprising forming a buffer layer between the substrate and the lower clad layer.

8. A method for fabricating a visible light semiconductor laser device by molecular beam epitaxy, the method comprising:

subjecting a GaAs substrate of one conductivity type to a first growth procedure to built up on the substrate a lower clad layer made of a semiconductor of the one conductivity type of the formula, $(Al_xGa_{1-x})_yIn_{1-y}P$, wherein x is in the range of from 0.5 to 1.0 and y is in the range of from 0.47 to 0.53, an un-doped GaInP active layer, an upper clad layer made of a semiconductor of the other conductivity type of the formula, $(Al_xGa_{1-x})_yIn_{1-y}P$, wherein x and y have, respectively, the same meanings as defined above, a protective layer made of $Ga_zIn_{1-z}P$ wherein z is in the range of from 0.47 to 0.53, and a current blocking layer of GaAs in this order, thereby obtaining a built-up structure on the substrate;

etching the current blocking layer to a level of the protective layer to make a stripe groove with a predetermined width with which current passage is narrowed;

removing the protective layer on the stripe groove; and subjecting the thus removed built-up structure to a second growth procedure to form a cap layer on the built-up structure.

9. A method according to claim 8, wherein there is formed, instead of the cap layer, a layer which has a double-layer structure including a $(Al_xGa_{1-x})_yIn_{1-y}P$ layer of the other conductivity type, wherein x and y have, respectively, the same meanings as defined in claim 1, and a GaAs layer of the other conductivity type formed on the $(Al_xGa_{1-x})_yIn_{1-y}P$ layer of the other conductivity type, said $(Al_xGa_{1-x})_yIn_{1-y}P$ layer of the other conductivity type being in contact with the upper clad layer through the stripe groove.

* * * * *